(12) United States Patent
Brown et al.

(10) Patent No.: US 9,648,745 B2
(45) Date of Patent: May 9, 2017

(54) SYSTEMS AND METHODS FOR MOUNTING THE PRINTED WIRING ASSEMBLY TO THE HEADER ASSEMBLY OF A PRESSURE SENSOR

(71) Applicant: Honeywell International Inc., Morristown, NJ (US)

(72) Inventors: Gregory C. Brown, Chanhassen, MN (US); Thomas J. Rolfer, Andover, MN (US); Peter J. Dukich, Blaine, MN (US)

(73) Assignee: Honeywell International Inc., Morris Plains, NJ (US)

( * ) Notice: Subject to any disclaimer, the term of this patent is extended or adjusted under 35 U.S.C. 154(b) by 198 days.

(21) Appl. No.: 14/521,287

(22) Filed: Oct. 22, 2014

(65) Prior Publication Data
US 2016/0120035 A1 Apr. 28, 2016

(51) Int. Cl.
| | |
|---|---|
| *G01L 9/00* | (2006.01) |
| *H05K 1/18* | (2006.01) |
| *G01L 19/14* | (2006.01) |
| *H05K 3/30* | (2006.01) |

(52) U.S. Cl.
CPC ............... *H05K 1/181* (2013.01); *G01L 9/00* (2013.01); *G01L 19/147* (2013.01); *H05K 3/303* (2013.01); *H05K 2201/10151* (2013.01); *H05K 2203/0285* (2013.01)

(58) Field of Classification Search
None
See application file for complete search history.

(56) References Cited

U.S. PATENT DOCUMENTS

| | | |
|---|---|---|
| 8,013,405 B2 | 9/2011 | Eriksen et al. |
| 8,065,917 B1 | 11/2011 | Brown et al. |
| 8,234,926 B2 | 8/2012 | Wohlgemuth et al. |
| (Continued) | | |

FOREIGN PATENT DOCUMENTS

JP 2003232693 8/2003

OTHER PUBLICATIONS

European Patent Office, "Extended European Search Report from EP application No. 15190923.1 mailed Mar. 1, 2016", "from foreign counterpart of U.S. Appl. No. 14/521,287", Mar. 1, 2016, pp. 1-7, Published in: EP.

(Continued)

*Primary Examiner* — Andre Allen
(74) *Attorney, Agent, or Firm* — Fogg & Powers LLC

(57) ABSTRACT

Systems and method for mounting the printed wiring assembly to the header assembly of a pressure sensor are provided. In at least one embodiment, the pressure sensor comprises: a header assembly; a printed wiring assembly having a pressure sensor mounted thereon; and, at least one substantially cylindrical member that mechanically couples the printed wiring assembly to the header assembly. The substantially cylindrical member has a substantially hollow core, a substantially circular first end attached to the header assembly, a substantially circular second end opposite the substantially circular first end, and at least one side extending from the substantially circular first end to the substantially circular second end of the cylindrical member. Furthermore, the substantially circular second end or the at least one side or both are attached to the printed wiring assembly.

20 Claims, 8 Drawing Sheets

(56) References Cited

U.S. PATENT DOCUMENTS

| | | |
|---|---|---|
| 8,371,175 B2 | 2/2013 | Romo |
| 2003/0230146 A1 | 12/2003 | Imai et al. |
| 2004/0129084 A1* | 7/2004 | Ikeda ................... G01F 1/383 |
| | | 73/716 |
| 2005/0056097 A1 | 3/2005 | Banholzer et al. |
| 2007/0040817 A1* | 2/2007 | Underwood ........... B43K 7/005 |
| | | 345/179 |
| 2011/0255224 A1* | 10/2011 | Van Woensel ........ H01L 21/565 |
| | | 361/679.01 |
| 2012/0324998 A1 | 12/2012 | Fujiwara et al. |

OTHER PUBLICATIONS

Kopola et al., "MEMS Sensor Packaging Using LTCC Substrate Technology", "Device and Process Technologies for MEMS and Microelectronics II", 2001, pp. 148-158, vol. 4592.

Ngo et al., "Liquid-Free, Piezoresistive, SOI-Based Pressure Sensor for High Temperature Measurements up to 400 C", 2012, pp. 1-4, Published in: IT.

\* cited by examiner

SYSTEMS AND METHODS FOR MOUNTING THE PRINTED WIRING ASSEMBLY TO THE HEADER ASSEMBLY OF A PRESSURE SENSOR

BACKGROUND

Aerospace pressure sensors often operate over extended temperature ranges ranging from −55° C. to 300° C. Moreover, the pressure sensors are also subject to high-vibration environments, which are sometimes in excess of 100 g's. Due to these wide temperature variations and high vibration environments, the printed wiring assembly (PWA) that includes the electronics to support the pressure sensor needs to be mounted to the header assembly of the pressure sensor. Great care must be taken with the mounting of the PWA so that the thermal strains generated by the differences in thermal expansion between the PWA and the header assembly do not cause thermal fatigue failure. Moreover, the vibration requirements limit the mounting techniques to those that do not cause fretting or cracking under high vibration loading.

For the reasons stated above and for reasons stated below which will become apparent to those skilled in the art upon reading and understanding the specification, there is a need in the art for improved systems and methods for mounting the PWA to the header assembly.

SUMMARY

The Embodiments of the present disclosure provide systems and method for mounting the printed wiring assembly to the header assembly of a pressure sensor.

In at least one embodiment, the pressure sensor comprises: a header assembly; a printed wiring assembly having a pressure sensor mounted thereon; and, at least one substantially cylindrical member that mechanically couples the printed wiring assembly to the header assembly. The substantially cylindrical member has a substantially hollow core, a substantially circular first end attached to the header assembly, a substantially circular second end opposite the substantially circular first end, and at least one side extending from the substantially circular first end to the substantially circular second end of the cylindrical member. Furthermore, the substantially circular second end or the at least one side or both are attached to the printed wiring assembly.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
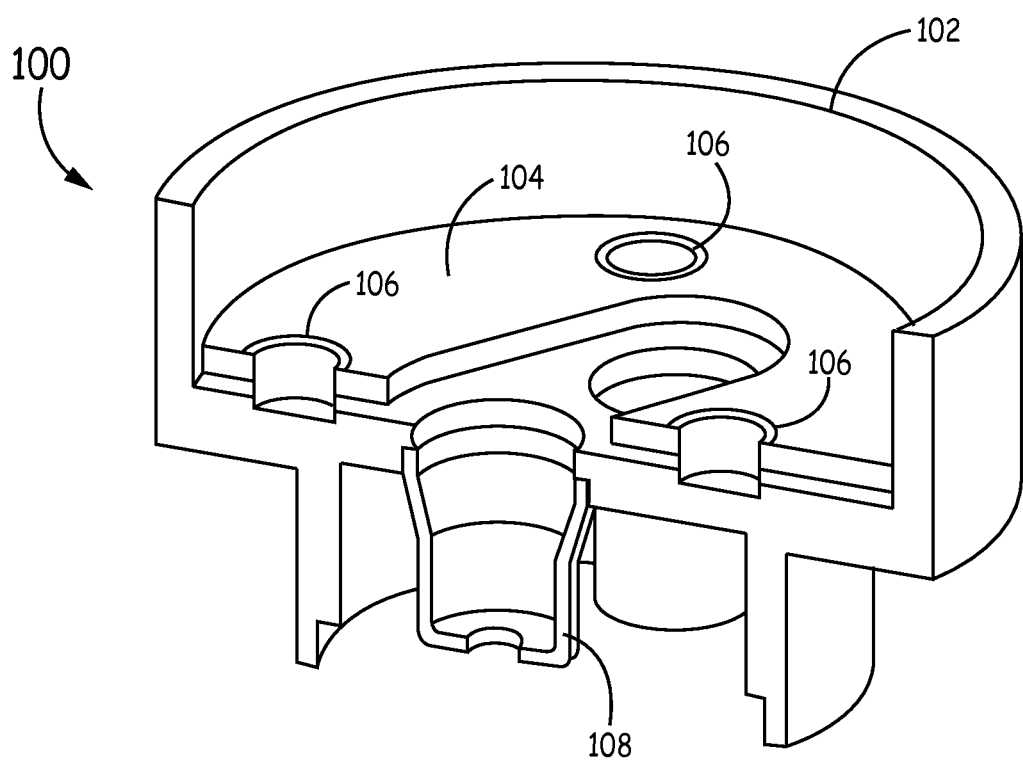
FIG. 1 is a diagram of an example PWA that is mechanically coupled to the header assembly of a pressure sensor using a substantially cylindrical member.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed.

As stated above, there is a need in the art for improved systems and methods for mounting a printed wiring assembly (PWA) to a header assembly in a pressure sensor. The embodiments in this disclosure provide a solution by coupling the PWA to the header assembly using at least one substantially cylindrical member, wherein the at least one substantially cylindrical member has a substantially hollow core. Due to the at least one substantially cylindrical member having a substantially hollow core, the at least one substantially cylindrical member can flex during heating and cooling of the PWA, accommodating the thermal strains developed due to coefficient of thermal expansion (CTE) mismatches between the header assembly material and the ceramic substrate of the PWA. Furthermore, due to the embodiments described herein, less surface area of the PWA may be used than when screws are used to couple the header assembly to the PWA (as is done in many conventional implementations) because fewer cylindrical members can be used to secure the PWA to the header assembly. Also, due to the embodiments described herein, there may be less chance of foreign object damage than in conventional implementations where screws are screwed into the header assembly and debris is released into the pressure sensor cavity as a result.

FIG. 1 is a diagram of an example PWA 104 that is mechanically coupled to the header assembly 102 of a pressure sensor 100 using at least one substantially cylindrical member 106. The PWA 104 is also referred to herein as a printed circuit board (PCB) 104. The pressure sensor device 100 includes a header assembly 102 and a printed wire assembly (PWA) 104 with a pressure sensor mounted onto a pyrex tube (not shown). The pressure sensor device 100 also includes one or more pressure port interfaces 108 that provide a conduit for the pressure source outside the header assembly 102 to come into contact with the pressure sensor mounted onto a pyrex tube directly below the PWA 104. As stated above, the PWA 104 is mechanically coupled to the header assembly 102 by at least one substantially cylindrical member 106 (also be referred to herein as the cylindrical member 106).

The header assembly 102 is a shell that defines a sensor cavity that includes the PWA 104. The sensor cavity inside the header assembly 102 is at a reference pressure (oftentimes referred to as a "reference vacuum"). The reference pressure is used to measure the absolute pressures of the pressure source located outside the header assembly 102. In many embodiments, the header assembly 102 is made of steel and other metals. As discussed above and below, these materials that the header assembly 102 is comprised of have different CTE's than the PWA 104.

In exemplary embodiments, the PWA 104 is made from high-density Alumina and is approximately 0.050 inches thick. However, in other embodiments, the PWA 104 can be made of other materials and be of other thicknesses, as well. An advantage of high-density Alumina is that it affords strength, stability and minimal outgassing. Since the PWA 104 is located in the same sealed compartment with the pressure sensor, minimal outgassing is advantageous for precise, highly stable silicon piezoresistive pressure sensors. If any outgassing inside the sensor cavity occurs, the reference pressure in the sensor cavity can be adversely effected, which can degrade the performance of the pressure sensor 100. As a result, mounting techniques using adhesives to secure the header assembly 102 to the PWA 104 might not be viable options since the adhesives could result in outgassing. Moreover, if an adhesive is used, it may need to withstand the high operating temperatures that the pressure sensor 100 can be subjected to, which is not feasible for many adhesives.

The mounting technique shown in FIG. 1 and discussed throughout this disclosure solve these problems and provide increased reliability over the design service life. Specifically, in exemplary embodiments, at least one cylindrical member 106 mechanically couples the header assembly 102 to the PWA 104. While three cylindrical members 106 are shown in FIG. 1, more or less cylindrical members 106 may be used to couple the header assembly 102 to the PWA 104. In exemplary embodiments, three cylindrical members 106 are used to mechanically couple the PWA 104 to the header assembly 102. This allows a stable base for the PWA 104 and utilizes a small amount of space on the PWA 104.

In exemplary embodiments, the cylindrical member 106 can be made from Kovar, a low expansion alloy. In other embodiments, other low expansion alloys can be used to make the cylindrical member 106. Using a low expansion alloy can provide a good TEC match between the thickness and height change of the of the PWA 104 material and the cylindrical member 106. However, in other embodiments, different materials can be used for the cylindrical member 106 and these examples are not meant to be limiting. Furthermore, in exemplary embodiments, the thickness of the sides of the cylindrical member(s) 106 can be adjusted (thinned or thickened) to force any resonances due to the mass of the PWA 104 and the spring constant of the cylindrical member(s) 106 to be well above 2 kHz.

FIGS. 2A-2D are diagrams of examples of the cylindrical member 106 shown in FIG. 1. The cylindrical members 200A-200D have a substantially hollow core 202, a substantially circular first end 204, a substantially circular second end 206 opposite the substantially circular first end 204 and at least one side 208 extending from the substantially circular first end 204 to the substantially circular second end 206 of the cylindrical member 200A-200D. In some embodiments, substantially circular includes perfectly circular. In other embodiments, substantially circular includes oval shapes. An advantage of the second end 206 and first end 204 being substantially circular is that any stress put on the cylindrical member 200A-200D from the thermal expansion of the PWA 104 can be absorbed uniformly or roughly uniformly by the cylindrical members 200A-200D.

Figure 2A:
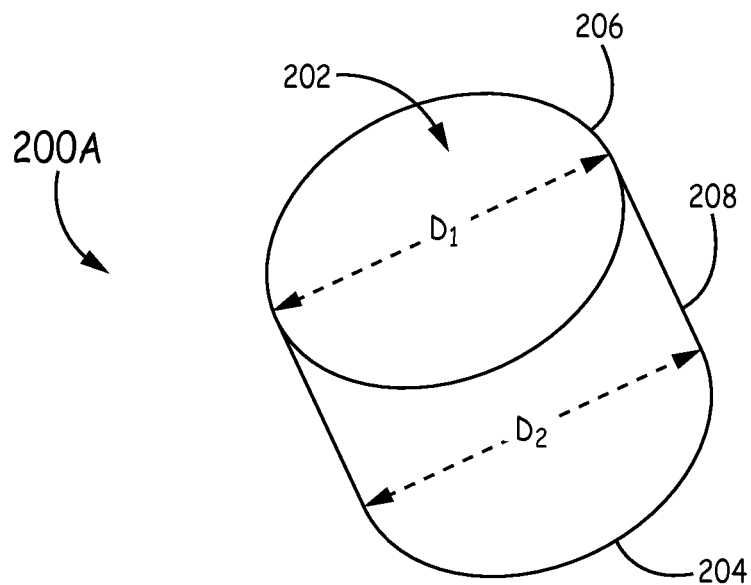
FIGS. 2A-2D are diagrams of examples of the cylindrical member shown in FIG. 1.

FIG. 2A is an example of a cylindrical member 200A. In this example, in addition to the characteristics described above, the interior diameter of the second end 206, $D_1$, and the interior diameter of the first end 204, $D_2$, of the cylindrical member 200A are substantially equal, i.e., $D_1 \approx D_2$. Furthermore, in this embodiment, the first end 204 and the second end 206 are open. However, this is only an example and in some embodiments, the first end 204 can be closed as shown in some embodiments below.

Figure 2B:
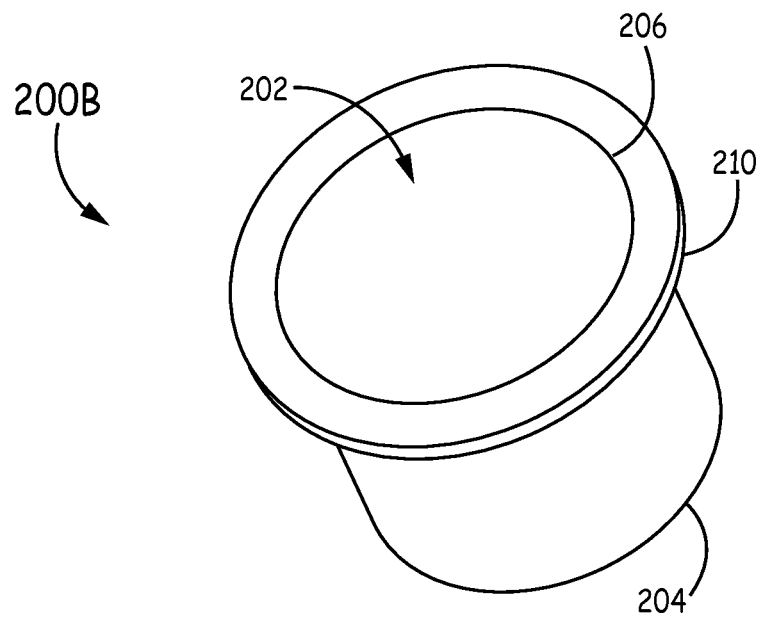

FIG. 2B is another example of a cylindrical member 200B. In this example, the cylindrical member 200B includes a flange 210 extending from the second end 206 of the cylindrical member 200B. As described in more detail below, the flange 210 can be helpful in securing the cylindrical member 200B to the PWA 104.

Figure 2C:
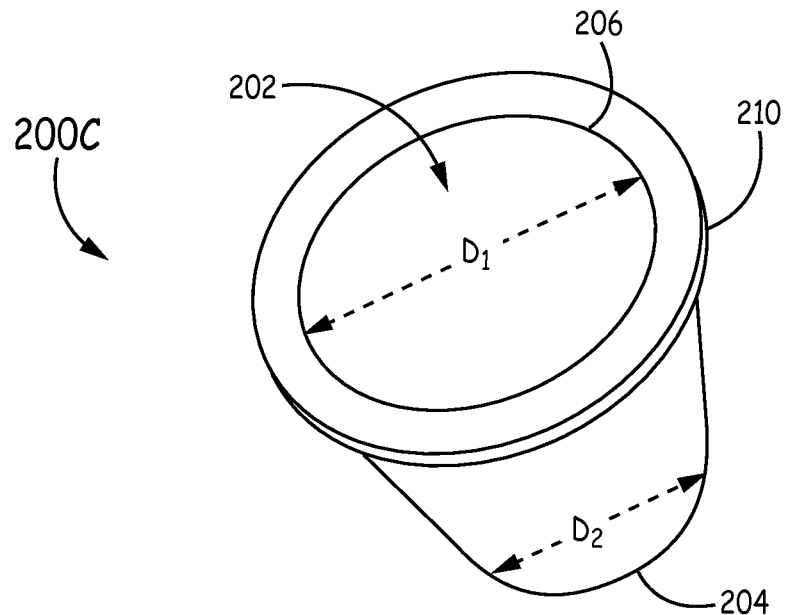

FIG. 2C is another example of a cylindrical member 200C. In this example, the interior diameter of the second end, $D_1$, is greater than the interior diameter of the first end, $D_2$, i.e., $D_1 > D_2$. In some embodiments, this can lead to easier manufacturing when inserting the cylindrical member 200C into the hole that is bored through the PWA 104 for the cylindrical member 200C, as explained below. While a flange 210 is shown included in this cylindrical member 200C, in some embodiments, the cylindrical member 200C does not include a flange 210.

Figure 2D:
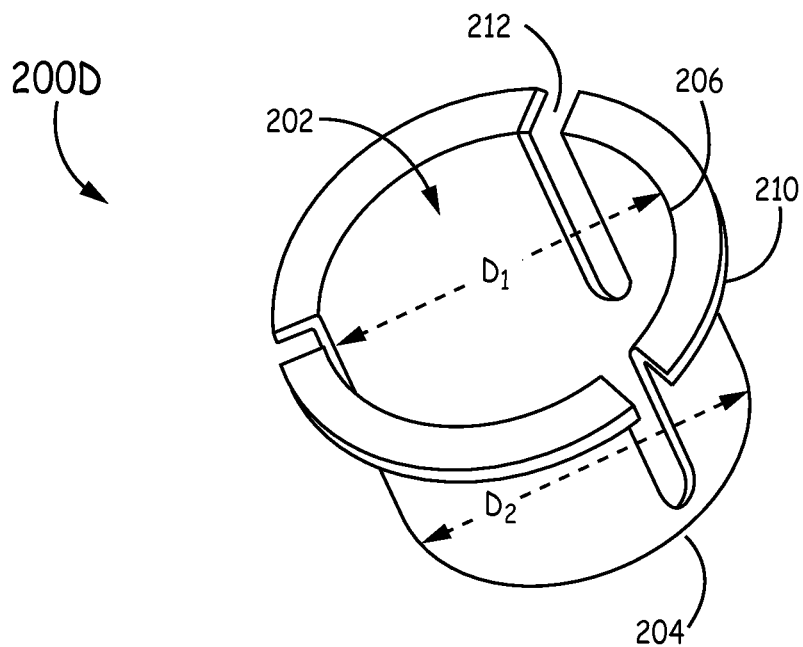

FIG. 2D is another example of a cylindrical member 200D. In this example, the cylindrical member 200D includes at least one elongate slot 212 extending from substantially the first end 204 to the second end 206 of the cylindrical member 200D. In some embodiments, this may help absorb some of the pressure due to the thermal expansion of the PWA 104. While the cylindrical member 200C is shown with a flange 210, in some embodiments, the cylindrical member 200D does not include a flange 210. Moreover, while the interior diameter of the second end, $D_1$, is shown to be substantially equal to the interior diameter of the first end, $D_2$, in some embodiments, $D_1$ can be greater than $D_2$.

FIGS. 3A-3G are cross-sectional views of examples of header assemblies 302, PWAs 304 and cylindrical members 306A-306G that mechanically couple 308 the PWAs 304 to the header assemblies 306 in a pressure sensor. In FIGS. 3A-3G, only a single cylindrical member 306A-306G is shown to mechanically couple 308 the PWA 304 to the header assembly 302; however, as mentioned above, more cylindrical members 306A-306G may be used to mechanically couple 308 the PWA 304 to the header assembly 302. In exemplary embodiments, three cylindrical members 306A-306G are used to mechanically couple 308 the PWA 304 to the header assembly 302; however, this is only an example and not meant to be limiting. Moreover, while the cylindrical members 306A-306G are shown with an interior diameter of the second end being substantially equal to the interior diameter of the first end, in some embodiments, the interior diameter of the second end can be greater than the interior diameter of the first end. Furthermore, even though the cylindrical members 306A-306G are shown with a flange, in some embodiments, the cylindrical members 306A-306G may not include a flange.

Figure 3A:
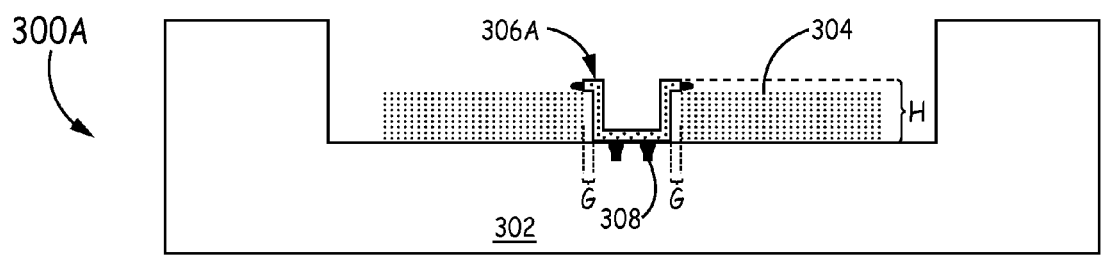
FIGS. 3A-3G are cross-sectional views of examples of header assemblies, PWAs and cylindrical members that couple the PWAs to the header assemblies in a pressure sensor.
Figure 3B:
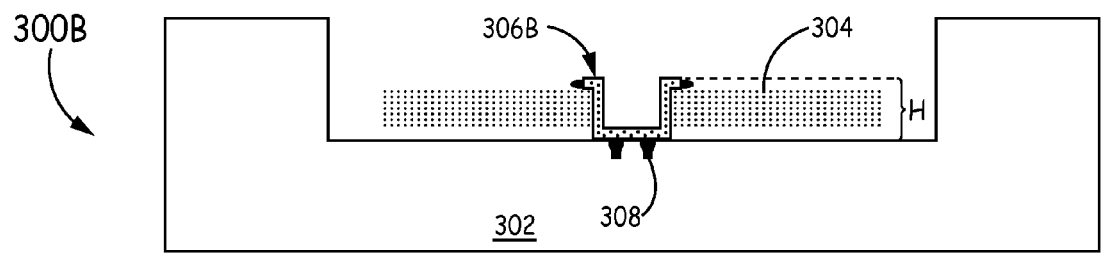

As can be seen from FIGS. 3A-3E, 3G, a hole is bored through the PWA 304 that allows a cylindrical member 306A-306G to be inserted into the hole of the PWA 304. In exemplary embodiments, the holes may include a metallization pattern (not shown) around the mounting hole, which is suitable for brazing or soldering to. Furthermore, in some embodiments, the diameter of the hole might be slightly larger than the outer diameter of the cylindrical members 306A so that there is a gap, G, between the sides of the cylindrical member 306A and the sides of the PWA 304, as shown in FIG. 3A. In other embodiments, there may not be a gap between the sides of the cylindrical members 306B and the sides of the PWA 304, as shown in FIG. 3B.

In some embodiments, the cylindrical members 306A-306G can be mechanically coupled 308 to the PWAs 304 using one or more of the following techniques: spot welding, laser welding, ultrasonic welding, gold pressure bonding, soldering or brazing. In exemplary embodiments, the cylindrical members 306A-306G are soldered to the PWAs 304. Similarly, in some embodiments, the substantially circular first end of the cylindrical members 306A-306G can be mechanically coupled 308 to the header assemblies 302 using one or more of the following techniques: spot welding, laser welding, ultrasonic welding, gold pressure bonding, soldering or brazing. In exemplary embodiments, the cylindrical members 306A-306G are spot welded to the header assembly, which does not re-melt the soldered used to mechanically couple 308 the cylindrical members 306A-306G to the PWAs 304. As discussed above, these techniques provide an advantage to using adhesives because the adhesive may provide some outgassing and/or melt under the temperature variation of the pressure sensor. However, in some embodiments, an adhesive can still be used to mechanically couple 308 the cylindrical members 306A-306G to the header assemblies 302 and the PWAs 304.

Figure 3C:
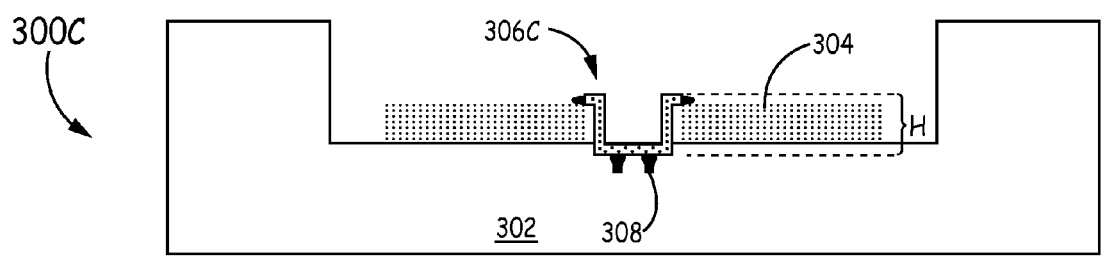
Figure 3D:
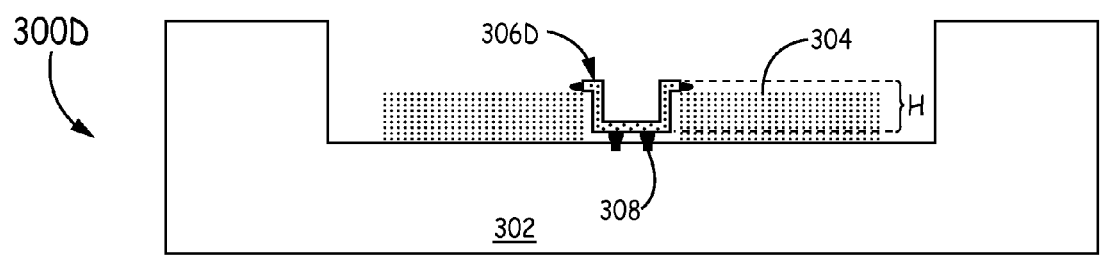

As can be seen from comparing FIGS. 3A-3D, different heights, H, of the cylindrical members 306A-306D can be used in different embodiments. In some embodiments, a height, H, of the cylindrical member 306A can be used so that the first end of the cylindrical member 306A is flush with the surface of the PWA 304, as shown in FIG. 3A. In other embodiments, the height, H, of the cylindrical member 306B, 306C can be such that the first end of the cylindrical member 306B, 306C extends past the surface of the PWA 304, as shown in FIGS. 3B-3C. In some of these embodiments, the header assembly 302 may provide an inset for the cylindrical member 306C to be inserted into, as shown in FIG. 3C; while in other embodiments, the header assembly 302 does not have an inset and the PWA 304 is suspended from the header assembly 302 by the cylindrical member 306B as shown in FIG. 3B. In even other embodiments, the height, H, of the cylindrical member 306D can be such that the first end of the cylindrical member 306D is slightly recessed from the surface of the PWA 304. In some of these embodiments, a spot weld can be applied to the first end of the cylindrical member 306D that deforms the first end enough to provide a compression mount between the cylindrical member 306D and the PWA 304.

Figure 3E:
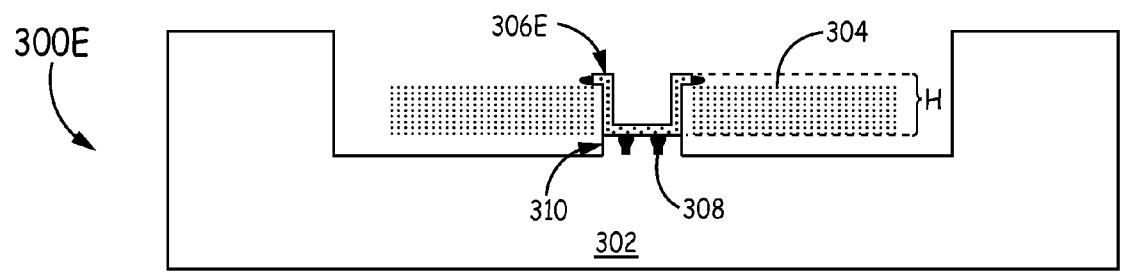

In some embodiments, the header assembly 302 can include a header boss 310 that the cylindrical element 306E can be mechanically coupled 308 to, as shown in FIG. 3E. The header boss 310 can be useful to elevate the PWA 304 so that when the header assembly 302 experiences thermal expansion, the chances of the header assembly 302 warping and/or providing pressure on the PWA 304 is lessened.

Figure 3F:
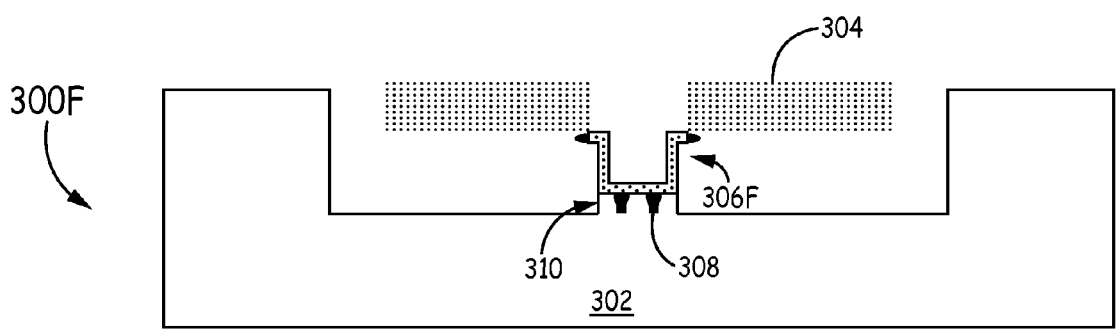

In some embodiments, the cylindrical element 306F can be mechanically coupled 308 to the bottom of the PWA 304, as shown in FIG. 3F. An advantage of mechanically coupling the cylindrical element 306F to the bottom of the PWA 304 is that in some embodiments, the cylindrical element 306F is drawn or formed from sheet metal and drawn parts require radii at all corners. These radii can cause interference with the sharp corners normally fabricated on the PWA 304. While the PWA 304 corners can be chamfered or radius-ed, it requires an expensive diamond tool processes. Thus, the advantage of mounting the PWA 304 on top of the cylindrical member 306F is that these corners are no longer capable of interfering and potentially causing a PWA 304 failure due to cracking.

Figure 3G:
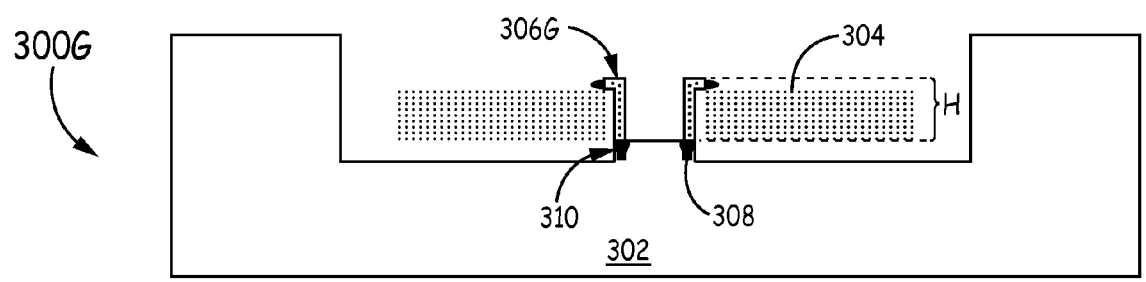

As mentioned above with respect to FIG. 2A, in some embodiments the cylindrical member 306G can have a first end that is open, as shown in FIG. 3G. However, this is only an example and in many embodiments, the first end of the cylindrical member 306A-306F is closed, as shown in FIGS. 3A-3F.

Figure 4:
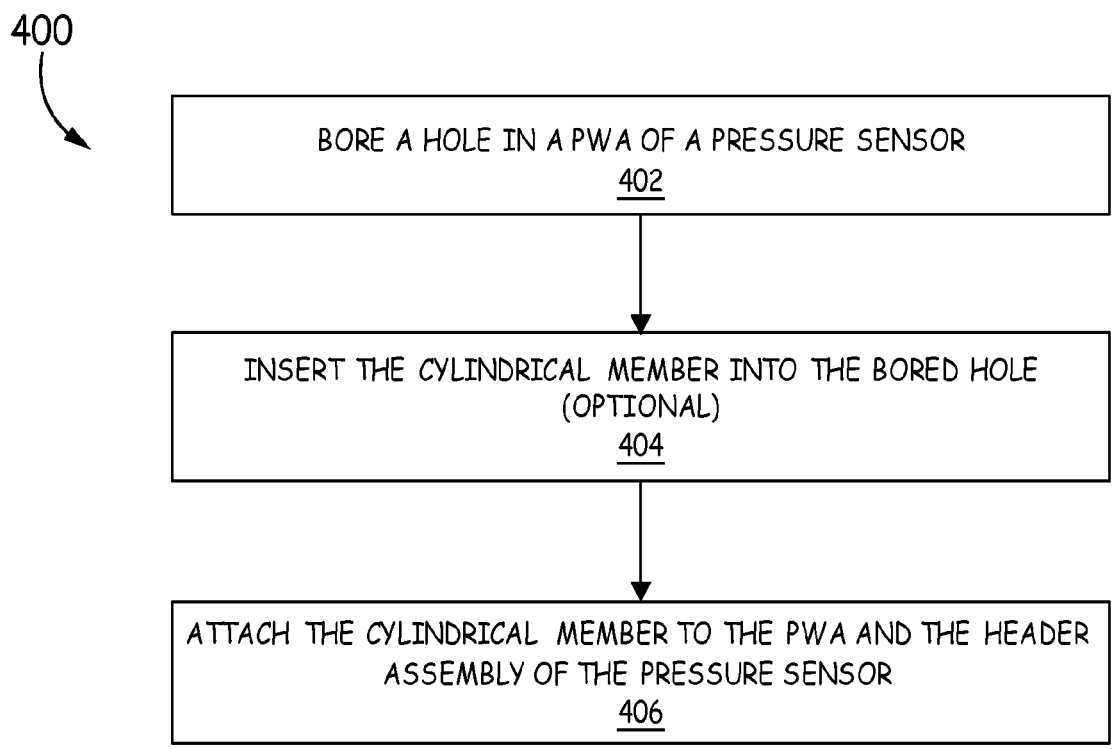
FIG. 4 is a flow diagram of an example method for mechanically coupling a PWA to a header assembly of a pressure sensor device.

FIG. 4 is a flow diagram of an example method 400 for mechanically coupling a PWA to a header assembly of a pressure sensor device. The pressure sensor device, the PWA and the header assembly here can have some or all of the same characteristics as the pressure sensor device 100, the PWAs 104, 304 and the header assemblies 102, 302 discussed above in FIGS. 1-3, respectively. For example, the header assembly can be made of a metal alloy while the PWA is made of high-density alumina. In exemplary embodiments, the PWA can be approximately 0.050 inches thick. However, in other embodiments, the PWA can have a thickness other than 0.050 inches. Furthermore, in some embodiments, the header assembly can include a header boss that the cylindrical element can be mechanically attached to, similar to FIG. 3E.

The method 400 comprises boring a hole in a PWA (block 402). In some embodiments, the size of the hole can have some or all of the same characteristics as the hole in the PWA 304 above. For example, in exemplary embodiments, the diameter of the hole might be slightly larger than the outer diameter of a cylindrical member that mechanically couples the PWA to a header (see below), so that there is a gap between the sides of the cylindrical member and the sides of the PWA. In other embodiments, there may not be a gap between the sides of the cylindrical members and the sides of the PWA. In other embodiments, the diameter of the hole may be small than the diameter of a cylindrical member that couples the PWA to a header (see below) when the cylindrical member is coupled to the bottom of the PWA, as shown above in FIG. 3F.

In some embodiments, the method 400 further comprises inserting a substantially cylindrical member into the bored hole (block 404). If the cylindrical member is coupled to the bottom of the PWA, however, this step is not necessary.

The method 400 further comprises attaching the substantially cylindrical member to the printed wiring assembly and the header assembly (block 406). The substantially cylindrical member has a substantially hollow core, a substantially circular first end, a substantially circular second end opposite the substantially circular first end, and at least one side extending from the substantially circular first end to the substantially circular second end of the cylindrical member. In other respects, in exemplary embodiments, the substantially cylindrical member has some or all of the same characteristics as the substantially cylindrical members 106, 200A-200D, 306A-306G discussed above. For example, in exemplary embodiments, the cylindrical member can be made of Kovar or another low expansion alloy. Furthermore, in exemplary embodiments, the exterior diameter of the cylindrical member can be approximately 0.062 inches with a height of 0.055 inches. However, in other embodiments, the exterior diameter and height of the cylindrical member may be different than 0.062 inches and 0.055 inches, respectively. Additionally, in exemplary embodiments, the thickness of the sides of the cylindrical member can be adjusted (thinned or thickened) to force any resonances due to the mass of the PWA and the spring constant of the cylindrical member to be well above 2 kHz.

Moreover, in some embodiments, the height of the cylindrical member can be such that the first end of the cylindrical member is flush with the surface of the PWA. In other embodiments, the height of the cylindrical member can be such that the first end of the cylindrical member extends past the surface of the PWA. In some of these embodiments, the header assembly may provide an inset for the cylindrical member to be inserted into; while in other embodiments, the header assembly does not have an inset and the PWA is suspended from the header assembly by the cylindrical member. In even other embodiments, the height of the cylindrical member can be such that the first end of the cylindrical member is slightly recessed from the surface of the PWA. In some of these embodiments, a spot weld can be applied to the first end of the cylindrical member which deforms the first end enough to provide a compression mount between the cylindrical member and the PWA.

In some embodiments, attaching the cylindrical member to the PWA and the header assembly can have some or all of the same characteristics as discussed above. For example, attaching the cylindrical member to the PWA can include one or more of the following methods: spot welding, laser welding, ultrasonic welding, gold pressure bonding, soldering or brazing. In exemplary embodiments, the cylindrical member is soldered to the PWA. Similar to above, the PWA can include metalized pads for the cylindrical member to be soldered onto. Similarly, in some embodiments, the first end of the cylindrical member can be attached to the header assembly by at least one of the following methods: spot welding, laser welding, ultrasonic welding, gold pressure bonding, soldering or brazing. In exemplary embodiments, the first end of the cylindrical member can be spot welded to the header assembly in such a manner that the solder does not re-melt.

Due to the embodiments described herein, the thermal strains developed due to TEC mismatches between the header assembly material and the ceramic substrate of the PWA in a pressure sensor are reduced when compared to conventional implementations. Furthermore, less surface area of the PWA is used than when screws are used to couple the header assembly the ceramic substrate because fewer cylindrical members can be used to secure the PWA to the header assembly. Also, due to the embodiments described herein, there is less chance of foreign object damage than in conventional implementations where screws are screwed into the header assembly and debris is released into the pressure sensor cavity as a result.

Example Embodiments

Example 1 includes a pressure sensor device comprising: a header assembly; a printed wiring assembly having a pressure sensor mounted thereon; and at least one substantially cylindrical member that mechanically couples the printed wiring assembly to the header assembly, wherein the substantially cylindrical member has a substantially hollow core, a substantially circular first end attached to the header assembly, a substantially circular second end opposite the substantially circular first end, and at least one side extending from the substantially circular first end to the substantially circular second end of the cylindrical member, and wherein the substantially circular second end or the at least one side or both are attached to the printed wiring assembly.

Example 2 includes the pressure sensor device of Example 1, wherein the at least one substantially cylindrical member includes a flange extending from the substantially circular second end.

Example 3 includes the pressure sensor device of any of Examples 1-2, wherein the substantially circular first end is a closed end.

Example 4 includes the pressure sensor device of any of Examples 1-3, wherein the interior diameter of the substantially circular second end is substantially equal to the interior diameter of the substantially circular first end.

Example 5 includes the pressure sensor device of any of Examples 1-4, wherein the interior diameter of the substantially circular second end is greater than the interior diameter of the substantially circular first end.

Example 6 includes the pressure sensor device of any of Examples 1-5, wherein the at least one side includes at least one elongated slot extending from substantially the substantially circular first end to the substantially circular second end.

Example 7 includes the pressure sensor device of any of Examples 1-6, wherein the at least one substantially cylindrical member is attached to the printed wiring assembly and to the header assembly by one or more of the following: spot welding, laser welding, ultrasonic welding, gold pressure bonding, soldering or brazing.

Example 8 includes the pressure sensor device of any of Examples 1-7, wherein the at least one substantially cylindrical member is made of Kovar.

Example 9 includes the pressure sensor device of any of Examples 1-8, wherein there is a gap between the at least one side and the printed wiring assembly.

Example 10 includes the pressure sensor device of any of Examples 1-9, wherein the height of the at least one substantially cylindrical member is greater than the height of the printed wiring assembly and wherein the substantially circular second end extends past a first surface of the printed wiring assembly and wherein the substantially circular first end extends past a second surface of the printed wiring assembly that is opposite the first surface of the printed wiring assembly.

Example 11 includes the pressure sensor device of any of Examples 1-10, wherein the substantially circular second end extends past a first surface of the printed wiring assembly and wherein the substantially first end does not extend past a second surface of the printed wiring assembly that is opposite the first surface of the printed wiring assembly.

Example 12 includes the pressure sensor device of any of Examples 1-11, wherein the thickness of the at least one side combined with the mass of the printed wiring assembly are configured to provide a resonant frequency above 2 kilohertz for the printed wiring assembly.

Example 13 includes a method for mechanically coupling a printed wiring assembly to a header assembly of a pressure sensor device, the method comprising: boring a hole in the printed wiring assembly; and attaching the substantially cylindrical member to the printed wiring assembly and the header assembly, wherein the substantially cylindrical member has a substantially hollow core, a substantially circular first end, a substantially circular second end opposite the substantially circular first end, and at least one side extending from the substantially circular first end to the substantially circular second end of the cylindrical member.

Example 14 includes the method of Example 13, further comprising inserting the substantially cylindrical member into the bored hole.

Example 15 includes the method of Examples 13-14, wherein attaching the substantially cylindrical member to the printed wiring assembly and the header assembly includes at least one of the following methods: spot welding, laser welding, ultrasonic welding, gold pressure bonding, soldering or brazing.

Example 16 includes the method of any of Examples 13-15, wherein the height of the substantially cylindrical member is greater than the height of the printed wiring assembly and wherein the substantially circular second end extends past a first surface of the printed wiring assembly and wherein the substantially circular first end extends past a second surface of the printed wiring assembly that is opposite the first surface of the printed wiring assembly.

Example 17 includes the method of any of Examples 13-16, wherein the substantially circular second end extends past a first surface of the printed wiring assembly and wherein the substantially circular first end does not extend past a second surface of the printed wiring assembly that is opposite the first surface of the printed wiring assembly.

Example 18 includes a pressure sensor device comprising: a header assembly; a printed circuit board having a pressure sensor mounted thereon; and at least one substantially cylindrical member having a substantially hollow core, a first end and an open second end opposite the first end, wherein the first end is mechanically coupled to the header assembly and the second end is mechanically coupled to the printed circuit board.

Example 19 includes the pressure sensor device of Example 18, wherein the header assembly includes at least one header boss and wherein the first end is mechanically coupled to the at least one header boss of the header assembly.

Example 20 includes the pressure sensor device of any of Examples 18-19, further comprising at least one feed though pin, wherein the at least one feed through pin is mechanically coupled to the header assembly and wherein the at least one feed through pin is wire bonded to the printed circuit board to provide additional stabilization to the printed circuit board.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A pressure sensor device comprising:
    a header assembly;
    a printed wiring assembly having a pressure sensor mounted thereon; and
    at least one cylindrical member that extends through and mechanically couples the printed wiring assembly to the header assembly,
        wherein the cylindrical member has a hollow core, a circular first end mounted to a surface of the header assembly, a circular second end opposite the circular first end, and at least one side extending from the circular first end to the circular second end of the cylindrical member, and
        wherein the circular second end or the at least one side or both are attached to the printed wiring assembly.

2. The pressure sensor device of claim 1, wherein the at least one cylindrical member includes a flange extending from the circular second end.

3. The pressure sensor device of claim 1, wherein the circular first end is a closed end.

4. The pressure sensor device of claim 1, wherein the interior diameter of the circular second end is equal to the interior diameter of the circular first end.

5. The pressure sensor device of claim 1, wherein the interior diameter of the circular second end is greater than the interior diameter of the circular first end.

6. The pressure sensor device of claim 1, wherein the at least one side includes at least one elongated slot extending from the circular first end to the circular second end.

7. The pressure sensor device of claim 1, wherein the at least one cylindrical member is attached to the printed wiring assembly and to the header assembly by one or more of the following: spot welding, laser welding, ultrasonic welding, gold pressure bonding, soldering or brazing.

8. The pressure sensor device of claim 1, wherein the at least one cylindrical member is made of Kovar.

9. The pressure sensor device of claim 1, wherein there is a gap between the at least one side and the printed wiring assembly.

10. The pressure sensor device of claim 1, wherein the height of the at least one cylindrical member is greater than the height of the printed wiring assembly and wherein the circular second end extends past a first surface of the printed wiring assembly and wherein the circular first end extends past a second surface of the printed wiring assembly that is opposite the first surface of the printed wiring assembly.

11. The pressure sensor device of claim 1, wherein the circular second end extends past a first surface of the printed wiring assembly and wherein the first end does not extend past a second surface of the printed wiring assembly that is opposite the first surface of the printed wiring assembly.

12. The pressure sensor device of claim 1, wherein the thickness of the at least one side combined with the mass of the printed wiring assembly are configured to provide a resonant frequency above 2 kilohertz for the printed wiring assembly.

13. A method for mechanically coupling a printed wiring assembly to a header assembly of a pressure sensor device, the method comprising:
    boring a hole in the printed wiring assembly; and
    attaching a cylindrical member to the printed wiring assembly and the header assembly, wherein the cylindrical member has a hollow core, a circular first end mounted to a surface of the header assembly, a circular second end opposite the circular first end, and at least one side extending from the circular first end to the circular second end of the cylindrical member through the hole.

14. The method of claim 13, further comprising inserting the cylindrical member into the bored hole.

15. The method of claim 13, wherein attaching the cylindrical member to the printed wiring assembly and the header assembly includes at least one of the following methods: spot welding, laser welding, ultrasonic welding, gold pressure bonding, soldering or brazing.

16. The method of claim 13, wherein the height of the cylindrical member is greater than the height of the printed wiring assembly and wherein the circular second end extends past a first surface of the printed wiring assembly and wherein the circular first end extends past a second surface of the printed wiring assembly that is opposite the first surface of the printed wiring assembly.

17. The method of claim 13, wherein the circular second end extends past a first surface of the printed wiring assembly and wherein the circular first end does not extend past a second surface of the printed wiring assembly that is opposite the first surface of the printed wiring assembly.

18. A pressure sensor device comprising:
    a header assembly;
    a printed circuit board having a pressure sensor mounted thereon; and
    at least one cylindrical member having a hollow core that extends through the printed circuit board, a first end and an open second end opposite the first end, wherein the first end is mounted to a surface to the header assembly and the second end is mechanically coupled to the printed circuit board.

19. The pressure sensor device of claim 18, wherein the header assembly includes at least one header boss and wherein the first end is mechanically coupled to the at least one header boss of the header assembly.

20. The pressure sensor device of claim 18, further comprising at least one feed though pin, wherein the at least one feed through pin is mechanically coupled to the header assembly and wherein the at least one feed through pin is wire bonded to the printed circuit board to provide additional stabilization to the printed circuit board.

* * * * *